US012813268B2

(12) United States Patent
Gopu et al.

(10) Patent No.: US 12,813,268 B2
(45) Date of Patent: Nov. 24, 2026

(54) HEAT-DISSIPATION STRUCTURES INCLUDING RADIAL FINS

(71) Applicant: QUALCOMM Incorporated, San Diego, CA (US)

(72) Inventors: Dhinesh Jambai Gopu, Bengaluru (IN); Eric Mattis, San Diego, CA (US); Shibsankar Sarkar, Hyderabad (IN)

(73) Assignee: QUALCOMM INCORPORATED, San Diego, CA (US)

( * ) Notice: Subject to any disclaimer, the term of this patent is extended or adjusted under 35 U.S.C. 154(b) by 209 days.

(21) Appl. No.: 18/660,390

(22) Filed: May 10, 2024

(65) Prior Publication Data

US 2025/0349672 A1 Nov. 13, 2025

(51) Int. Cl.
*H10W 40/00* (2026.01)
*H10W 40/43* (2026.01)

(52) U.S. Cl.
CPC .................................. *H10W 40/43* (2026.01)

(58) Field of Classification Search
CPC .................................................... H10W 40/43
USPC ........................................................ 361/702
See application file for complete search history.

(56) References Cited

U.S. PATENT DOCUMENTS

2009/0147476 A1* 6/2009 Han ...................... H10W 40/43 361/697
2015/0342091 A1* 11/2015 Scharinger ......... H05K 7/20418 165/80.3
2016/0345468 A1* 11/2016 Gonzalez ........... H05K 7/20409
2019/0043783 A1* 2/2019 Kaslusky .............. H10W 40/43
2022/0377935 A1* 11/2022 Korta ................. H05K 7/20145

OTHER PUBLICATIONS

International Search Report and Written Opinion for International Patent Application No. PCT/US2025/026341, mailed Sep. 18, 2025, 15 pages.

* cited by examiner

*Primary Examiner* — Zhengfu J Feng
(74) *Attorney, Agent, or Firm* — Withrow & Terranova, PLLC

(57) ABSTRACT

A heat-generating device, such as an integrated circuit (IC), including electronic circuits, creates a hot spot in a package from which heat needs to be dissipated at an adequate rate to prevent a temperature increase that could reduce performance or cause permanent damage. A heat-dissipation structure includes a first substrate, including a first side from which a plurality of fins extend orthogonally to a second substrate. The fins also extend radially from a first region of the first side of the first substrate. Heat in the first region may be conducted radially outward through the fins to cool the first region. In some examples, a fan may be disposed in the first region of the first substrate to force air radially outward between the fins to dissipate the heat from the fins. In some examples, a heat-generating device may be disposed on a second side of the first substrate.

18 Claims, 12 Drawing Sheets

TABLE 300

| | Ta (°C) | RADIAL FIN PITCH (°) | PACKAGE TDP (W) | Ts (°C) | Rsa (°C/W) | THERMAL PERFORMANCE IMPROVEMENT |
|---|---|---|---|---|---|---|
| CONVENTIONAL HEAT-DISSIPATION STRUCTURE | 25 | - | 100 | 63.2 | 0.382 | - |
| HEAT-DISSIPATION STRUCTURE 200 | 25 | 2° | 100 | 75.8 | 0.508 | -33% |
| | 25 | 2.5° | 100 | 57.9 | 0.329 | +14% |
| | 25 | 2.75° | 100 | 59.0 | 0.339 | 11% |
| | 25 | 3° | 100 | 61.9 | 0.369 | 3% |

FIG. 3

HEAT-DISSIPATION STRUCTURES INCLUDING RADIAL FINS

BACKGROUND

I. Field of the Disclosure

The technology of the disclosure relates generally to cooling electronic circuits and, in particular, to heat sinks for dissipating heat in electronic devices.

II. Background

Reductions in the sizes of electronic circuits are made possible by continued technological advancements in semiconductor fabrication. In particular, due to improved transistor fabrication methods, the density of transistors (e.g., the number of transistors in an area) on an integrated circuit continues to increase in electronic circuits of processor-based systems in hand-held electronic devices as well as larger computing systems. Since each transistor in an electronic circuit can generate heat during operation, the density of heat generation in electronic circuits also increases with technology. Excessive heat in an electronic circuit can reduce performance and may cause permanent damage to the transistors. Thus, various methods are employed to remove heat from electronic circuits.

Heat may be dissipated from an electronic circuit by way of radiation, convection, and/or conduction. Convective cooling may be performed using fans or other air-moving devices to force air across electronic circuits. Conductive cooling depends on the thermal conductivity of a package in which electronic circuits are contained and may be significantly improved by thermally coupling the electronic circuits to a heat sink. Heat sinks may be made of materials having a high thermal conductivity to allow the heat to flow away from the electronic circuits where it can dissipate convectively to the air.

SUMMARY

Aspects disclosed in the detailed description include heat-dissipation structures including radial fins. Related methods of radial fin heat-dissipation structures are also disclosed. In a package structure in an electronic device, a heat-generating device, such as an integrated circuit (IC), including electronic circuits, creates a hot spot from which heat needs to be dissipated at an adequate rate to prevent a temperature increase that could reduce performance or cause permanent damage. In an exemplary aspect, a heat-dissipation structure includes a first substrate, including a first side from which a plurality of fins extend orthogonally to a second substrate, and the fins also extend radially from a first region of the first side of the first substrate. Heat in the first region may be conducted radially outward through the fins to cool the first region. In some examples, a fan may be disposed in the first region of the first substrate to force air radially outward between the fins to dissipate the heat from the fins convectively. In some examples, a second region on a second side of the first substrate, opposite to the first region, may be configured to couple to a heat-generating device, such as an integrated circuit.

In this regard in one aspect, a heat-dissipation structure is disclosed. The heat-dissipation structure includes a first substrate of a first material comprising a first side comprising a first region and a plurality of fins of the first material disposed around the first region, each of the plurality of fins extending in a first direction orthogonal to the first side of the first substrate and extending in respective second directions radial from the first region. The heat-dissipation structure also includes a second substrate disposed on the plurality of fins.

In another aspect, a method of a heat-dissipation structure is disclosed. The method includes disposing, on a first side of a first substrate of a first material, a plurality of fins of the first material around a first region, each of the plurality of fins extending in a first direction orthogonal to the first side and extending in respective second directions radial from the first region. The method also includes disposing a second substrate on the plurality of fins.

BRIEF DESCRIPTION OF THE DRAWINGS

FIG. 3 is a table containing a summary of results showing measurements of examples of the exemplary heat-dissipation structure of FIGS. 2A-2D having different radial fin pitches for purposes of comparison to a conventional heat-dissipation structure;

DETAILED DESCRIPTION

Figure 1:
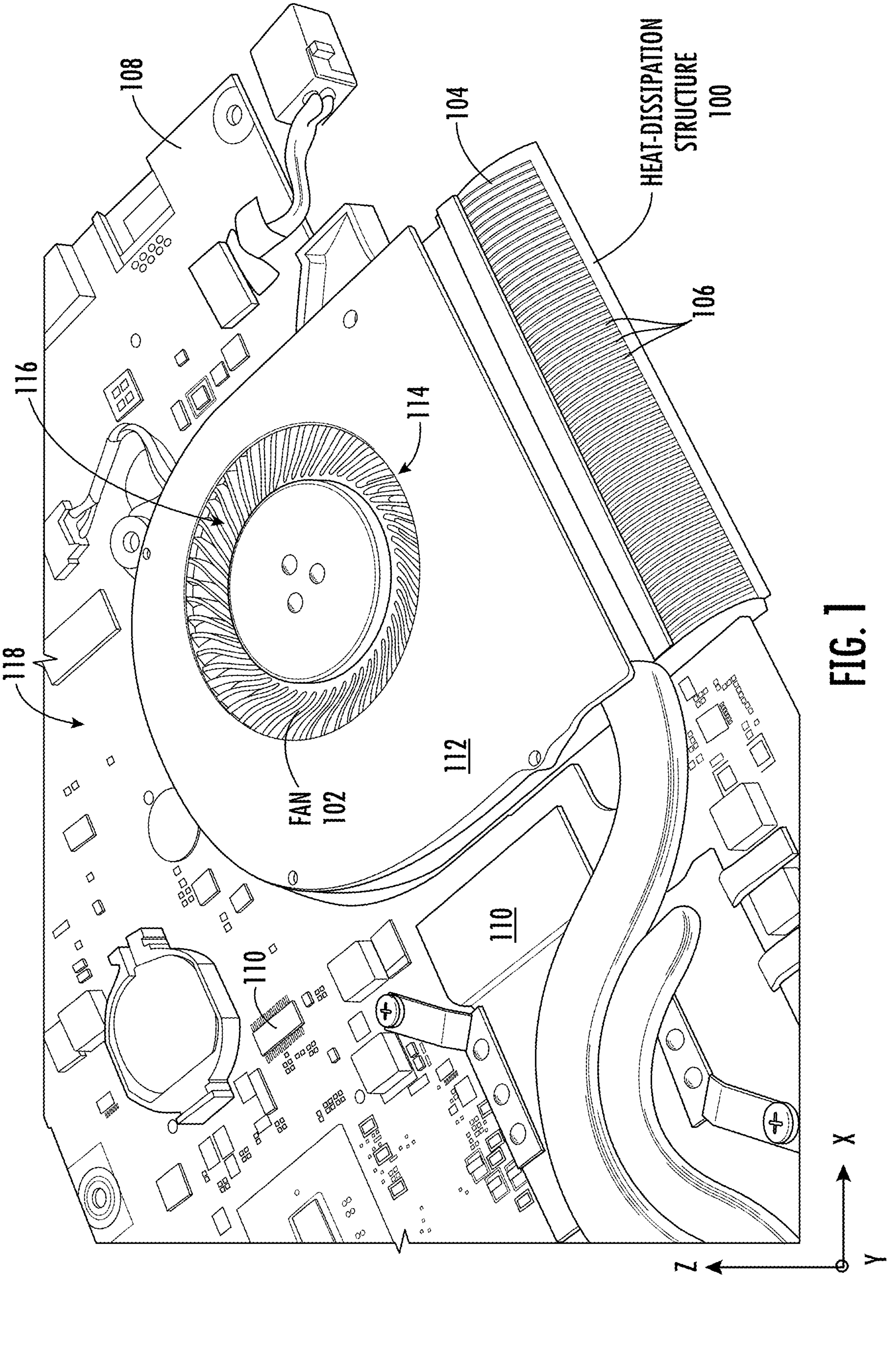
FIG. 1 is an illustration of a conventional heat-dissipation structure, including a fan and a heat sink with parallel fins employed to cool a substrate, including electronic circuits.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include heat-dissipation structures including radial fins. Related methods of radial fin heat-dissipation structures are also disclosed. In a package structure in an electronic device, a heat-generating device, such as an integrated circuit (IC) including electronic circuits, creates a hot spot from which heat needs to be dissipated at an adequate rate to prevent a temperature increase that could reduce performance or cause permanent damage. In an exemplary aspect, a heat-dissipation structure includes a first substrate, including a first side from which a plurality of fins extend orthogonally to a second substrate, and the fins also extend radially from a first region of the first side of the first substrate. Heat in the first region may be conducted radially outward through the fins to cool the first region. In some examples, a fan may be disposed in the first region of the first substrate to force air radially outward between the fins to dissipate the heat from the fins convectively. In some examples, a second region on a second side of the first substrate, opposite to the first region, may be configured to couple to a heat-generating device, such as an integrated circuit.

In this regard, FIG. 1 is an illustration of a conventional heat-dissipation structure 100, including a fan 102 and a heat sink 104 with parallel fins 106. The heat-dissipation structure 100 is disposed on a substrate 108, including electronic circuits 110, to dissipate heat that is generated in the electronic circuits 110. The fan 102 is enclosed in a fan enclosure 112, including an opening 114 through which ambient air 116 may be drawn into the fan enclosure 112 and forced onto a region 118 of the substrate 108 and out through the parallel fins 106. One of the electronic circuits 110 may be disposed in the region 118 of the substrate 108 on a same side S1 of the substrate 108 as the heat-dissipation structure 100 or on an opposite side S2 of the substrate 108 opposite to the region 118. In either case, the region 118 of the substrate 108 is heated by the electronic circuits 110 during operation. Accordingly, the heat-dissipation structure 100 may directly cool the electronic circuit 110 on a same side of the substrate 108 or may cool the region 118 of the substrate 108 corresponding to the electronic circuit 110 from the opposite side.

Some of the heat in the region 118 may be conducted to the parallel fins 106 of the heat sink 104. The ambient air 116 forced through the opening 114 and onto the region 118 by the fan 102 may be heated when coming into contact with the region 118, providing some convective cooling of the region 118. As the ambient air 116 enters the fan enclosure 112 through the opening 114 and is directed into contact with the region 118, an air pressure P may be created within the fan enclosure 112, causing the air 116 to be forced out of the fan enclosure 112 through the parallel fins 106. The air exits between the parallel fins 106 to cool the fins 106 and dissipate heat from the heat sink 104.

Although the heat-dissipation structure 100 significantly improves heat dissipation from the region 118, the flow of air into the opening 114 and out through the parallel fins 106 may not be as efficient as needed.

Figure 2A:
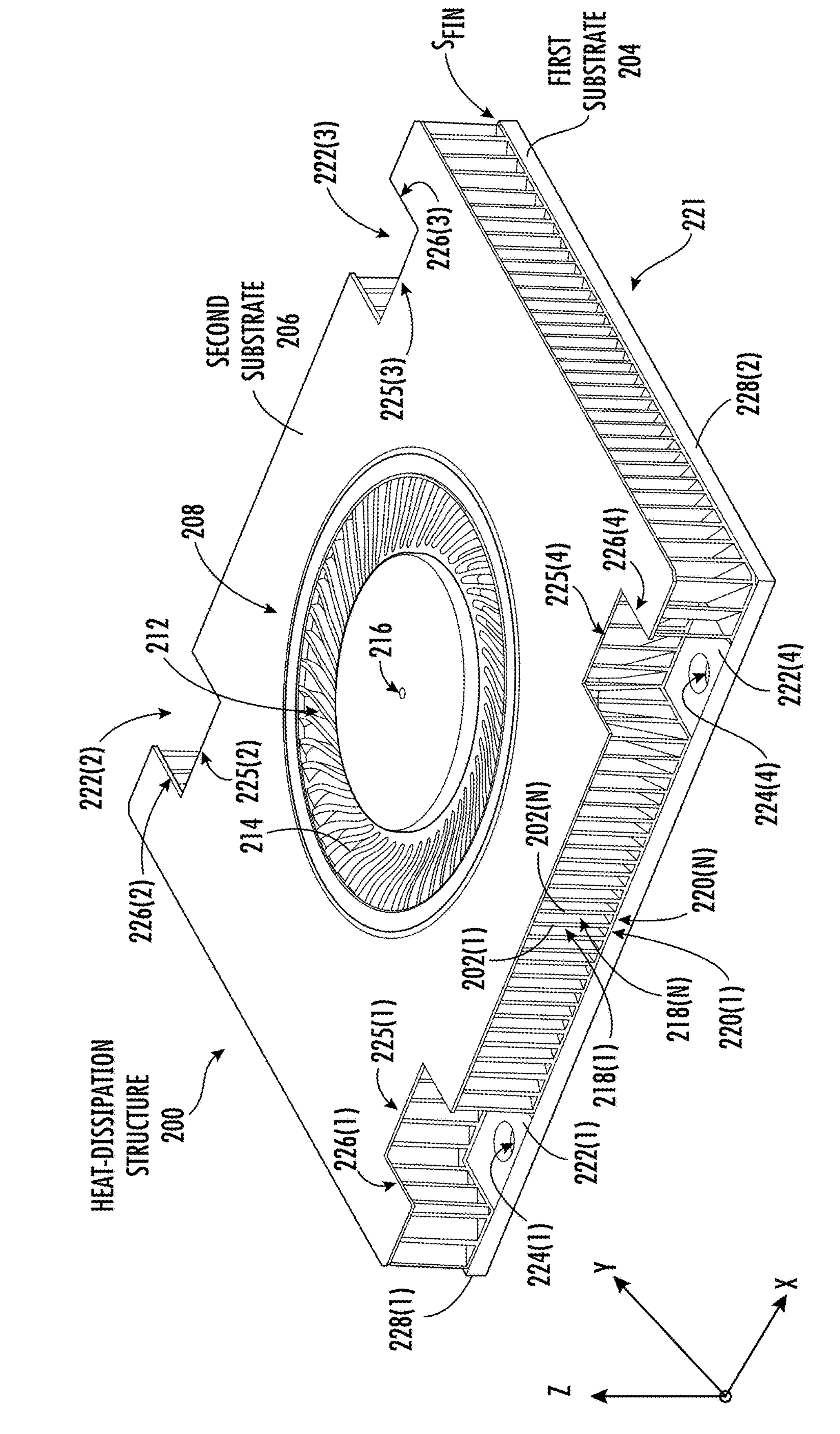
FIG. 2A is an illustration from a first perspective of an exemplary heat-dissipation structure, including fins extending orthogonally from a first side of a first substrate to a second substrate and radially from a first region of the first substrate, wherein a fan may be disposed in the first region.

In contrast, FIG. 2A is an illustration from a first perspective of an exemplary heat-dissipation structure 200 in which a plurality of fins 202(1)-202(N) extending in a first direction (Z-axis direction) orthogonally from a first side SPIN of a first substrate 204 to a second substrate 206. Each of the plurality of fins 202(1)-202(N) may extend to a same height $H_{202}$ in the first direction from the first side $S_{FIN}$ of the first substrate 204 and the second substrate 206 is disposed on the plurality of fins 202(1)-202(N). As shown more clearly in FIG. 2B, the fins 202(1)-202(N) also extend radially from a first region 208 of the first substrate 204 and, as discussed further below, the first region 208 may be a hot spot (e.g., highest temperature location) of the first substrate 204. The first region 208 may be central to the first substrate 204. To cool the first region 208, a fan 210 (or other air moving device) may be disposed in the first region 208. The fan 210 may draw air 212 from the environment into the first region 208 through an opening 214 and may force the air 212 in directions radial to a center axis 216 of the fan 210. The air 212 flows in passages 218(1)-218(N) between the respective fins 202 and exits through outlets 220(1)-220(N).

The first substrate 204, the second substrate 206, and the fins 202(1)-202(N) form a heat sink 221 configured to conduct heat radially outward from the first region 208. As the air 212 exits the first region 208 and flows through the passages 218(1)-218(N), the air 212 is heated by contact with the fins 202(1)-202(N), cooling the fins 202(1)-202(N) and dissipating the heat to the environment as the air 212 exits the heat-dissipation structure 200. In this manner, the fins 202(1)-202(N) provide a thermal conductor through which heat may be conducted away from the first region 208 and also provide a large surface area that allows the heat to be more readily dissipated to the air 212.

The heat-dissipation structure 200 includes at least one fastener region 222(1)-222(M), where M=4 in this example. The fastener regions 222(1)-222(M) include holes 224(1)-224(M) through the first substrate 204 is configured to receive a fastener (e.g., rivet or screw) (not shown) to secure the heat-dissipation structure 200 in a package or housing. In this regard, the second substrate 206 and the fins 202(1)-202(N) are excluded from the fastener regions 222(1)-222(M). In other words, some of the fins 202(1)-202(N) are terminated or truncated at inner sides 225(1)-225(4) of the fastener regions 222(1)-222(M) and, in some cases, may resume on lateral sides 226(1)-226(4) of the fastener regions 222(1)-222(3) between the lateral sides 226(1)-226(4) and edges 228(1)-228(2) of the first substrate 204. The second substrate 206 is contoured around the fastener regions 222(1)-222(M) to provide access to the holes 224(1)-224(M).

Figure 2B:
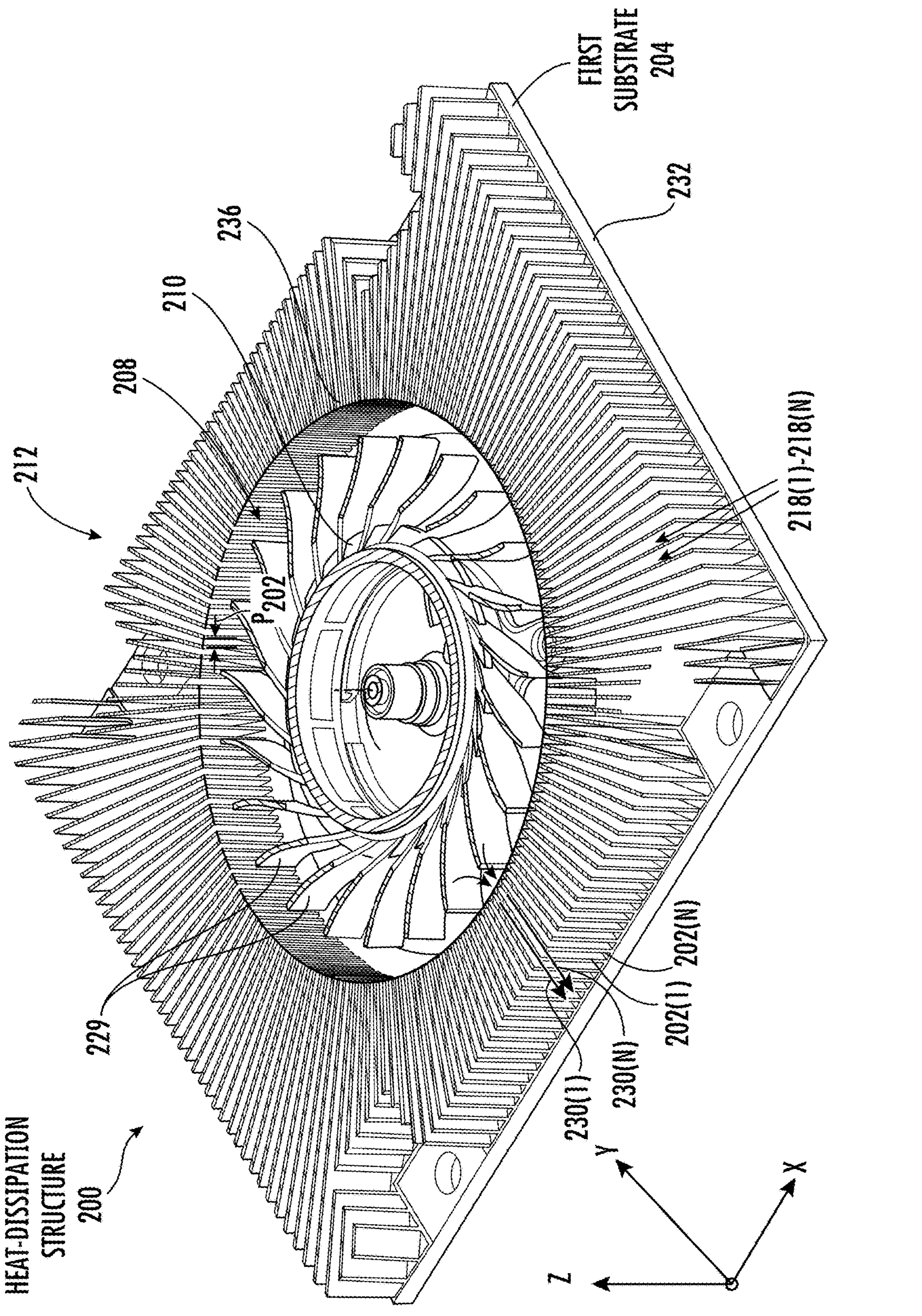
FIG. 2B is an illustration from the first perspective of the exemplary heat-dissipation structure in FIG. 2A without the second substrate to show the fins radially extending from the first region.

FIG. 2B is an illustration from the first perspective of the exemplary heat-dissipation structure 200 in FIG. 2A, but without the second substrate 206 (see FIG. 2A), to more clearly show the fins 202(1)-202(N) extending in a first (e.g., Z-axis) direction orthogonal to the first side $S_{FIN}$ of the first substrate 204 and extending in respective directions 230(1)-230(N) radially (e.g., in a plane including the X-axis and Y-axis) from the first region 208. The fins 202(1)-202(N) are disposed in an increasing numerical direction from 1 to N in the clockwise direction in FIG. 2B. The first substrate 204 may be comprised of or consisting of a first material 232, which may be a metal, such as copper or aluminum, or a metal alloy, or a non-metal material having a thermal conductivity comparable to that of a metal. The fins 202(1)-202(N) may also be comprised of or consisting of the first material 232.

FIG. 2B shows that the first region 208 in which the fan 210 is positioned is a circular region and the first ends 234(1)-234(N) of the fins 202(1)-202(N) are located along on a perimeter 236 of the circular first region 208. The first ends 234(1)-234(N) of the plurality of fins 202(1)-202(N) are disposed at a pitch $P_{202}$ based on a circumference of the perimeter 236 and on the number N of the plurality of fins 202(1)-202(N). The pitch $P_{202}$ is a center-to-center distance between two immediately adjacent ones of the plurality of fins 202(1)-202(N). The plurality of fins 202(1)-202(N) extend in the respective directions 230(1)-230(N) radially from the first region 208. In particular, the plurality of fins 202(1)-202(N) extend in the respective directions 230(1)-230(N) radially from the center axis 216 of the first region 208.

The fan 210 shown in FIG. 2B is also an example in which blades 229 rotate around the center axis 216 of the first region 208, forcing air 212 into the passages 218(1)-218(N).

Figure 2C:
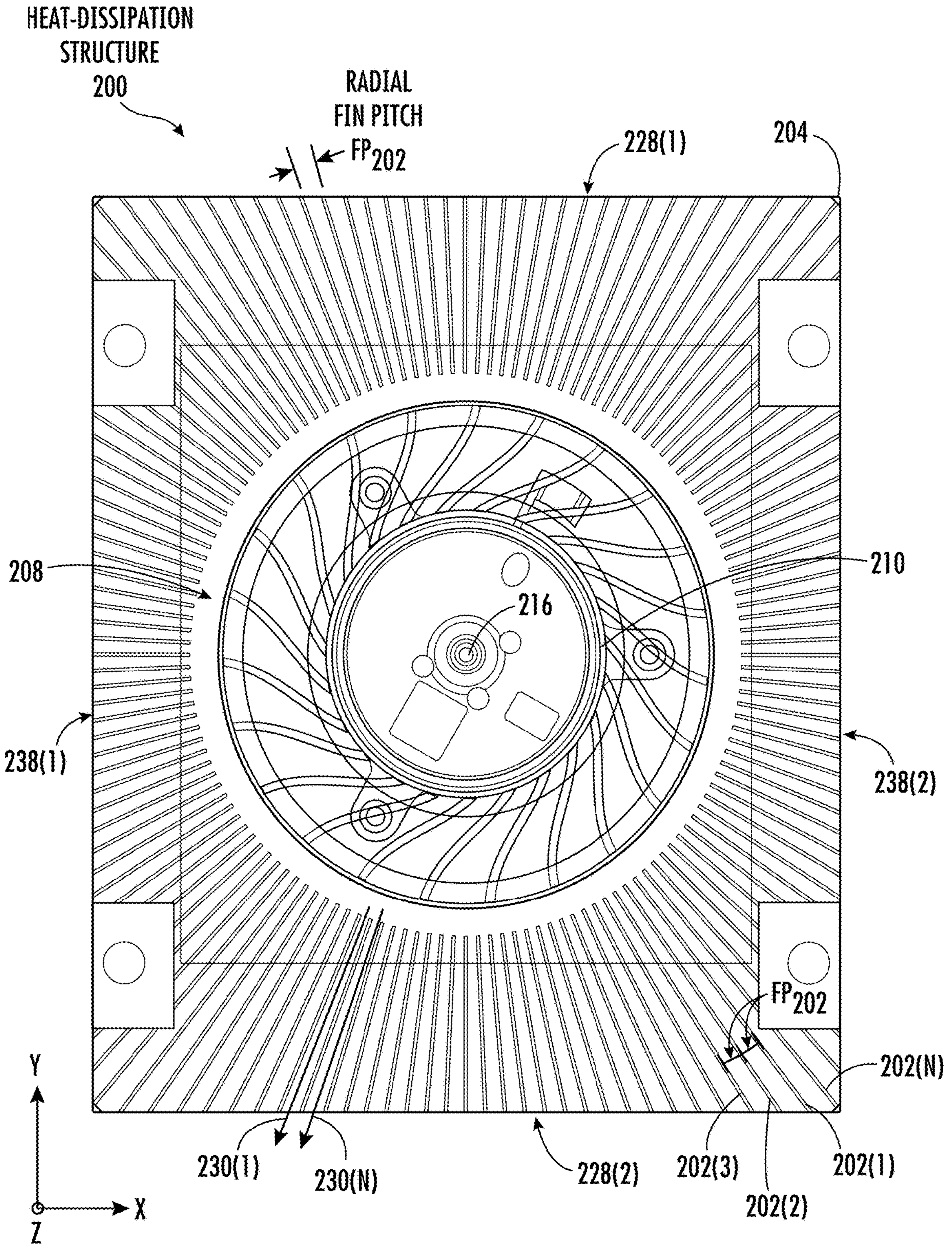
FIG. 2C is a plan view of the heat-dissipation structure as shown in FIG. 2B, from a position centered over the first region.

FIG. 2C is a plan view of the heat-dissipation structure 200 as shown in FIG. 2B, from a position over the center axis 216 of the fan 210 in the first region 208. In the example in FIGS. 2A-2C, the first substrate 204 is rectangular, having the first edge 228(1) parallel in a third direction to the second edge 228(2) and a third edge 238(1) parallel, in a fourth direction orthogonal to the third direction, a fourth edge 238(2). As clearly shown in this example, at least one of the plurality of fins 202(1)-202(N) extends to the first edge 228(1), at least one of the plurality of fins 202(1)-202(N) extends to the second edge 228(2), at least one of the plurality of fins 202(1)-202(N) extends to the third edge 238(1), at least one of the plurality of fins 202(1)-202(N) extends to the fourth edge 238(2). In some examples, such as cases in which the first edge 228(1) and the second edge 228(2) are relatively much longer than the third edge 238(1) and the fourth edge 238(2), some of the plurality of fins 202(1)-202(N) may not extend to the third edge 238(1) and/or the fourth edge 238(2).

FIG. 2C is also provided to show that the first region 208 is centered at the center axis 216 of the fan 210, which is also a center $C_{208}$ of the first substrate 204. From the perspective of FIG. 2C, it can be seen that the heat-dissipation structure 200 resembles a sunray fin structure in which the plurality of fins 202(1)-202(N) disposed around the first region 208 correspond to sunrays extending radially outward from the sun, but the heat-dissipation structure 200 is not limited in this regard. Additionally, the plan view in FIG. 2C shows that the fins 202(1)-202(N) are disposed at a radial fin pitch $FP_{202}$ around the center $C_{208}$ of the first region 208. The radial fin pitch $FP_{202}$ refers to having a consistent first angle between adjacent (e.g., immediately adjacent) fins of the plurality of fins 202(1)-202(N). As an example, the respective radial directions 230(1)-230(N) in which fins 202(1) and 202(3) extend have a first angle equal to the radial fin pitch $FP_{202}$ from the respective radial direction 230(2) in which fin 202(2) extends. Stated differently, fins 202(1) and 202(3) are each at a same angle equal to the radial fin pitch $FP_{202}$, in opposite directions, to the fin 202(2). In some examples, the radial fin pitch $FP_{202}$ may be in a range from two (2) degrees to three (3) degrees. In some examples, the radial fin pitch $FP_{202}$ may be in a range from 2.25 to 2.75 degrees. In some examples, the radial fin pitch $FP_{202}$ may be 2.5 degrees. In some examples, the plurality of fins 202(1)-202(N) comprises one-hundred forty-three (143) fins (e.g., N=143) with the radial fin pitch $FP_{202}$ of 2.5 degrees. In other words, at the radial fin pitch $FP_{202}$ of 2.5 degrees, there could be 144 fins 202(1)-202(N), but one is not included in this example if the space between fins is too small for a wire or cable for powering the fan 210. Thus, in such examples, there is a five (5) degree angle between one of the plurality of fins 202(1)-202(N) and an immediately adjacent one of the plurality of fins 202(1)-202(N).

Figure 2D:
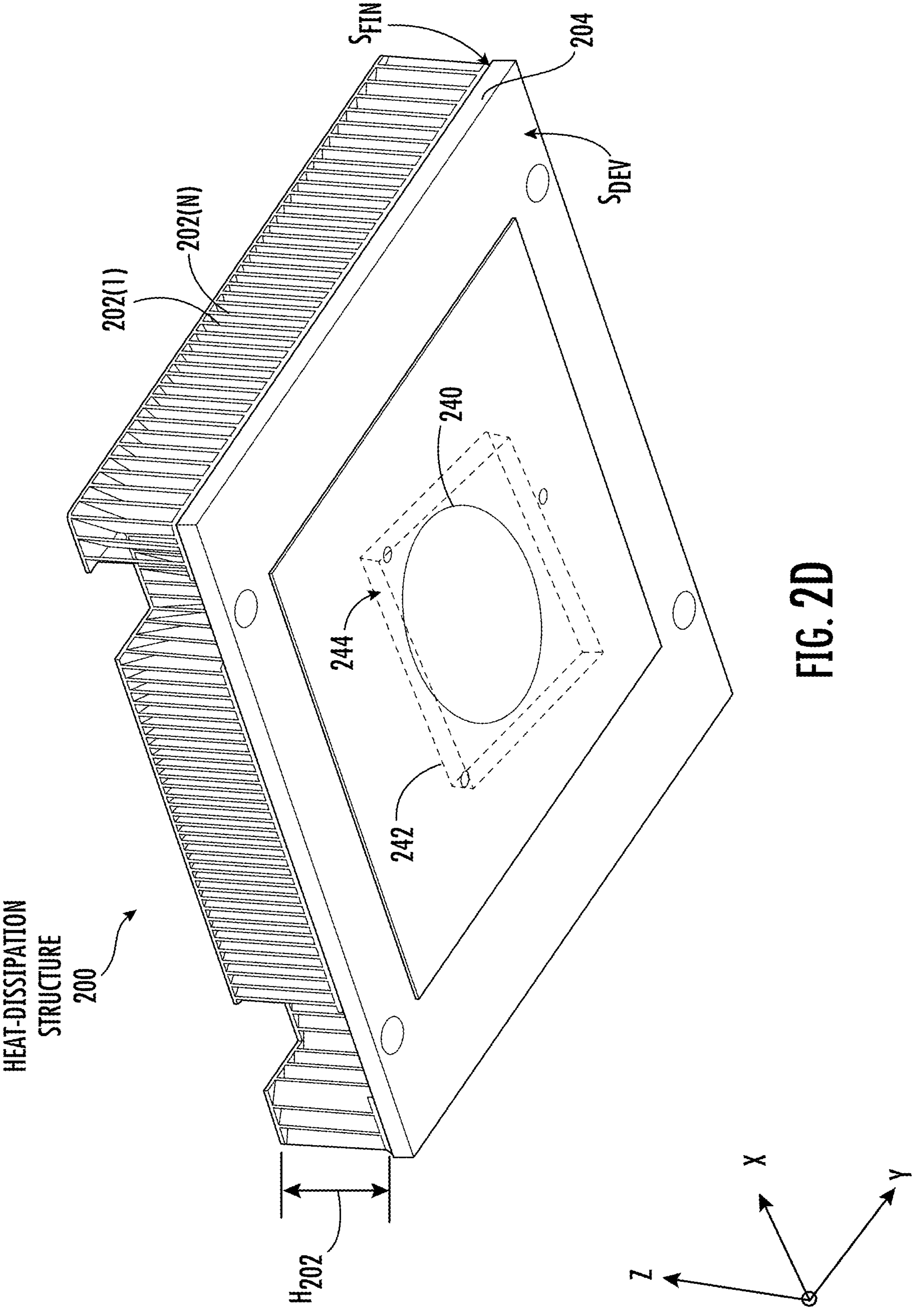
FIG. 2D is an illustration from a second perspective of the exemplary heat-dissipation structure to show a second side of the first substrate, which includes a region in which an electronic circuit may be disposed.

FIG. 2D is an illustration of the exemplary heat-dissipation structure 200 from a second perspective to show a second region 240, opposite to the first region 208, on a second side $S_{DEV}$ of the first substrate 204 and configured to be coupled (e.g., thermally) to a heat-generating device 242, which may comprise electronic circuits 244. The heat-generating device 242 generates heat that raises the temperature of the second region 240 and may also, by conduction through the first substrate 204, heat the first region 208 (not shown) on the first side $S_{FIN}$ of the first substrate 204. In some examples, the heat-generating device 242 may be mechanically coupled to the second region 240 on the second side $S_{DEV}$ of the first substrate 204 in the second region 240. Heat generated in the heat-generating device, which heats the first region 208 of the first substrate 204, may be dissipated by the heat-dissipation structure 200 to avoid a temperature increase of the electronic device to a first threshold at which performance of the electronic circuits 244 is reduced or to a second threshold at which permanent damage may be caused to the electronic circuits 244.

The fins 202(1)-202(N) may be formed in any appropriate manner. In some examples, the fins 202(1)-202(N) may be formed on the first side $S_{FIN}$ of the first substrate 204 by three-dimensional (3D) printing or fabricating or related methods. In some examples, the fins 202(1)-202(N) may be formed by a subtractive process in which material is removed from a slab of the first material 232 having a thickness equal to the height $H_{202}$ of the fins 202(1)-202(N).

FIG. 3 is a Table 300 containing a summary of results showing measurements of examples of the exemplary heat-dissipation structure of FIGS. 2A-2D having different radial fin pitches $FP_{202}$ in comparison to a conventional heat-dissipation structure.

The measurements in Table 300 were taken at an ambient temperature of 25 degrees C. with an electronic device coupled to the second region 240 having a package total dissipation power (TDP) of 100 Watts. The radial fin pitch $FP_{202}$ of the exemplary heat-dissipation structures 200 is tested at every quarter of a degree from two degrees to three degrees. As indicated by the surface temperature Ts (measured in degrees Celsius) and the surface to ambient resistance Rsa (degrees C. per watt), the heat-dissipation structure 200 performed (33%) worse than the conventional heat-dissipation structure at a radial fan pitch $FP_{202}$ of two (2.0) degrees, and only improved by a small (3%) percentage at 3.0 degrees $FP_{202}$. At a radial fin pitch $FP_{202}$ of 2.75 degrees, there was an 11% thermal performance improvement over the conventional heat-dissipation structure, and at a radial fin pitch $FP_{202}$ of 2.5 degrees, there was a 14% thermal performance improvement over the conventional heat-dissipation structure.

Figure 4:
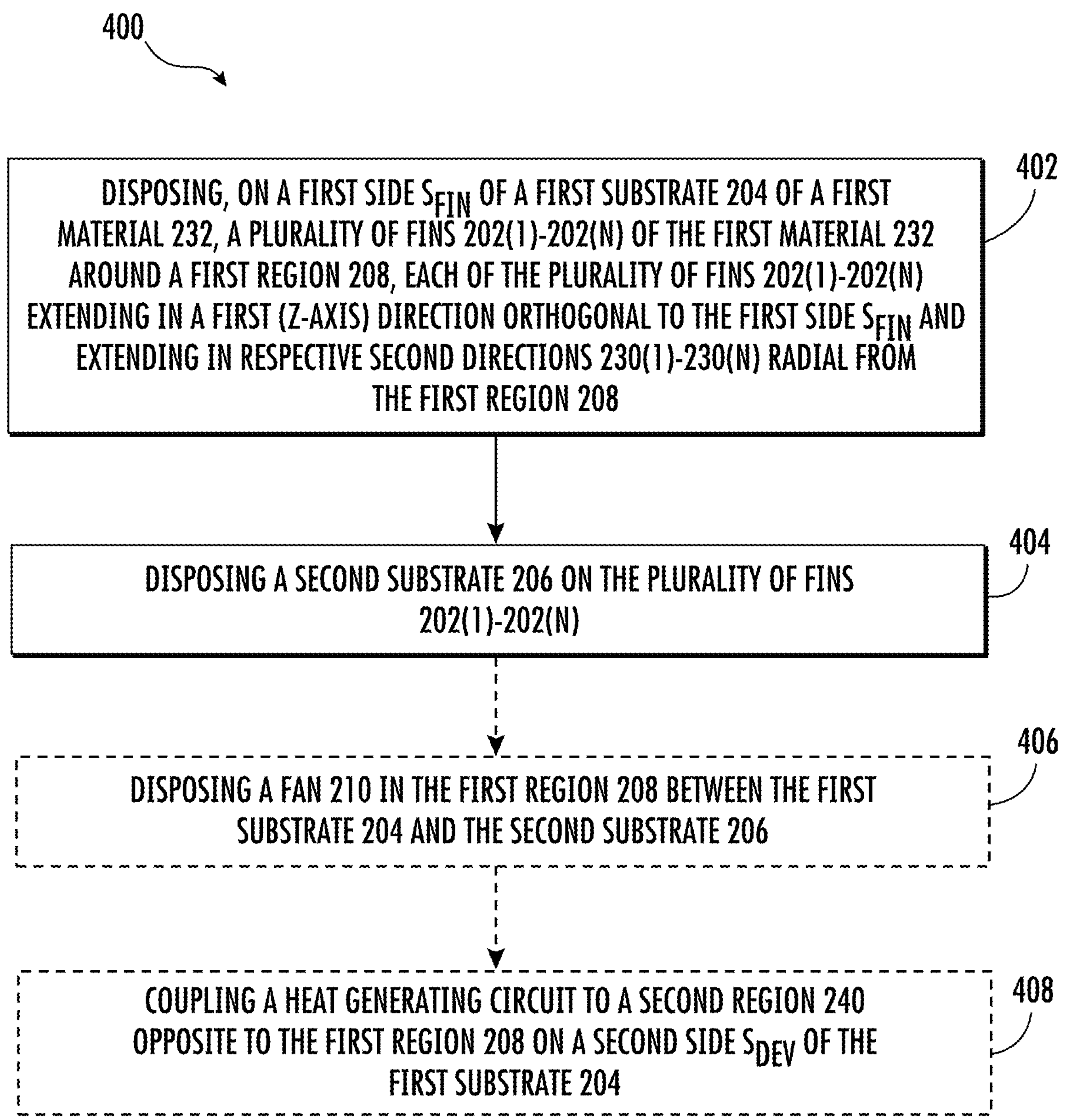
FIG. 4 is a flow chart of an exemplary method of dissipating heat employing the heat-dissipation structure of FIGS. 2A-2D.

FIG. 4 is a flow chart of an exemplary method 400 of heat-dissipation in the heat-dissipation structure of FIGS. 2A-2D. The method includes disposing, on a first side $S_{FIN}$ of a first substrate 204 of a first material 232, a plurality of fins 202(1)-202(N) of the first material 232 around a first region 208, each of the plurality of fins 202(1)-202(N) extending in a first (Z-axis) direction orthogonal to the first side $S_{FIN}$ and extending in respective second directions 230(1)-230(N) radial from the first region 208 (block 402); and disposing a second substrate 206 on the plurality of fins 202(1)-202(N) (block 404). The method may optionally include disposing a fan 210 in the first region 208 between the first substrate 204 and the second substrate 206 (block 406) and coupling a heat generating circuit to a second region 238 opposite to the first region 208 on a second side $S_{DEV}$ of the first substrate 204 (block 408).

Figure 5A:
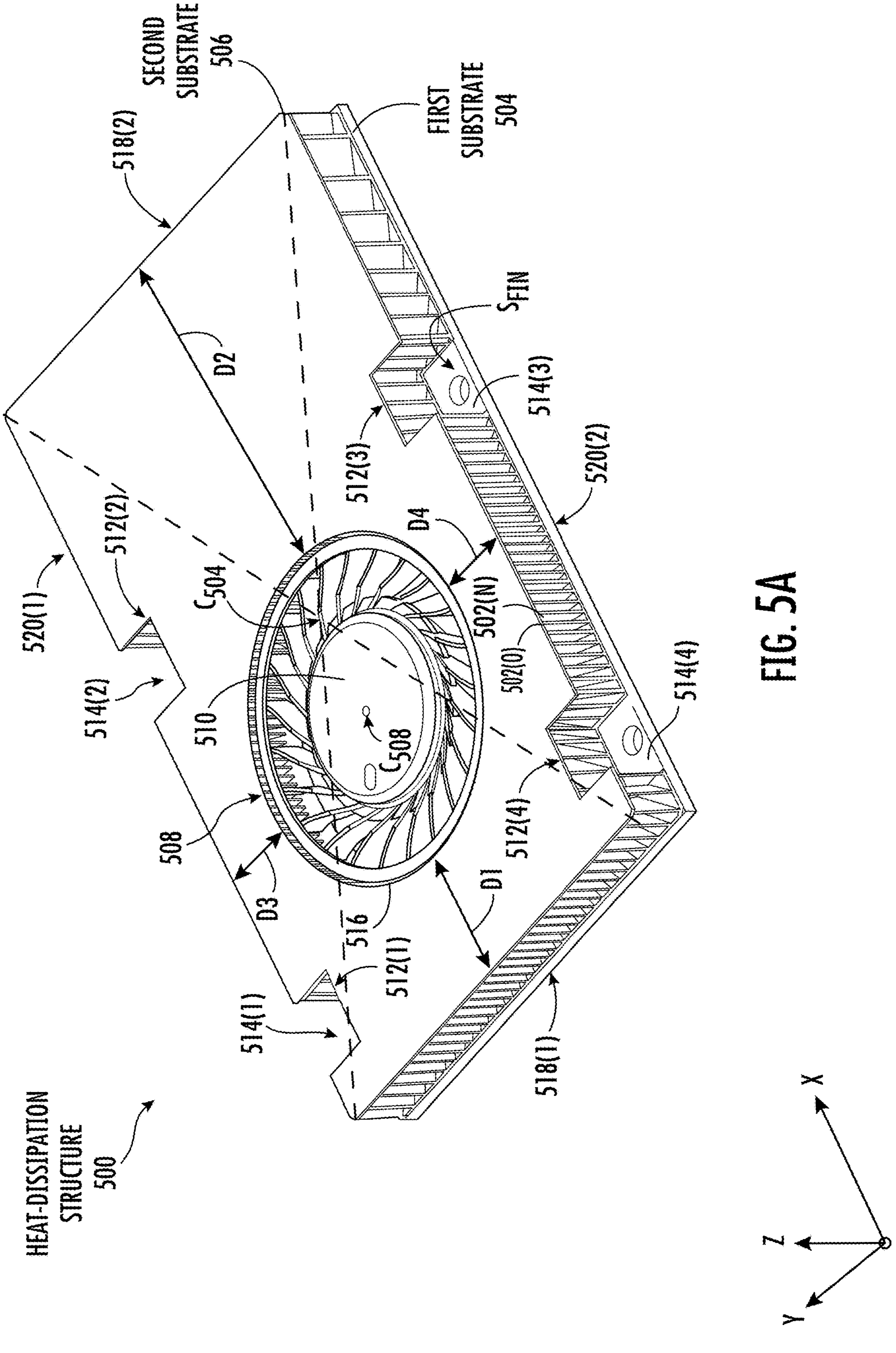
FIGS. 5A-5C are illustrations of a second example of the exemplary heat-dissipation structure disclosed herein corresponding to FIGS. 2A, 2B, and 2D, respectively, wherein a center of the first region is displaced from a center of the first substrate.
Figure 5B:
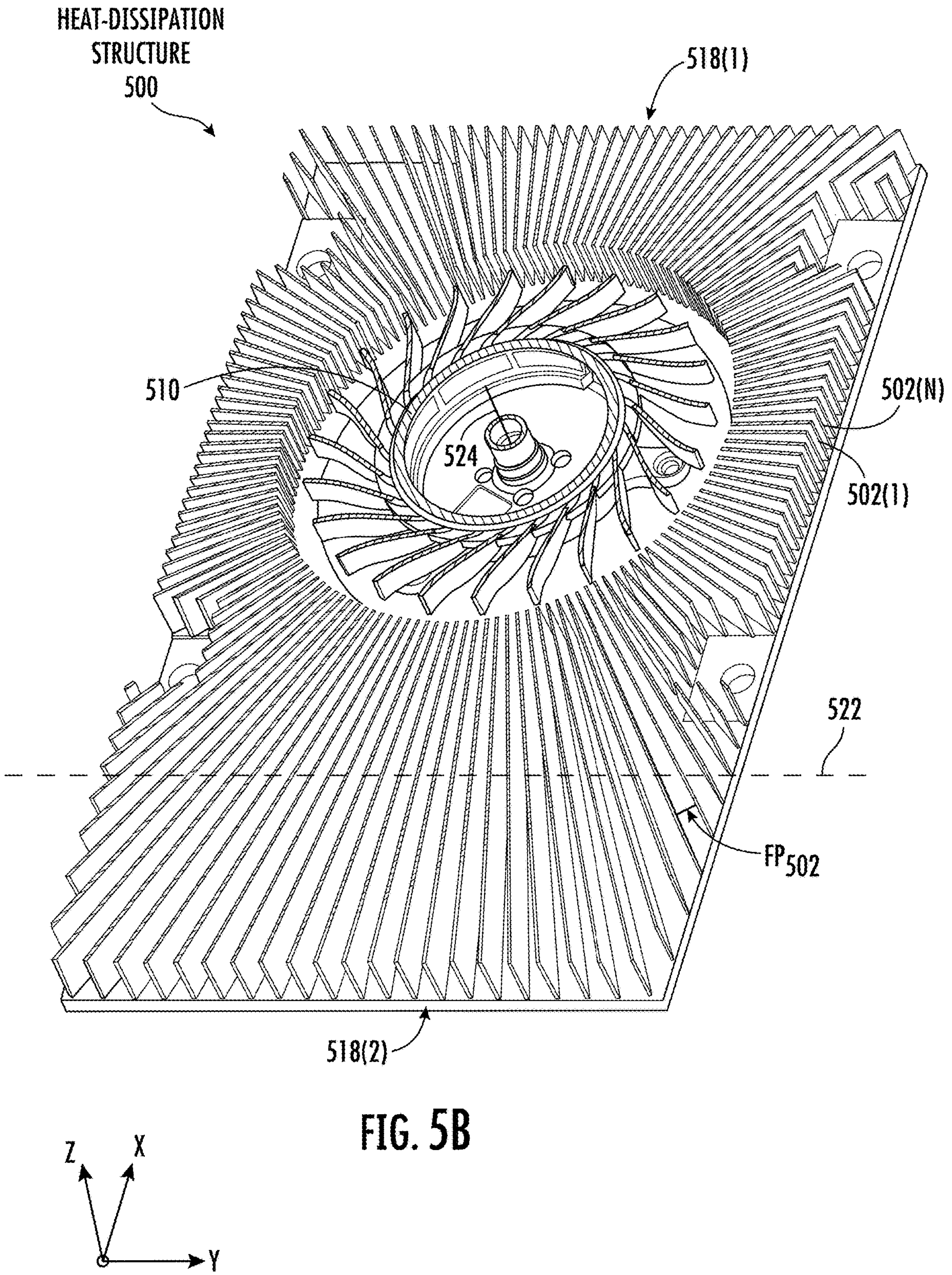
Figure 5C:
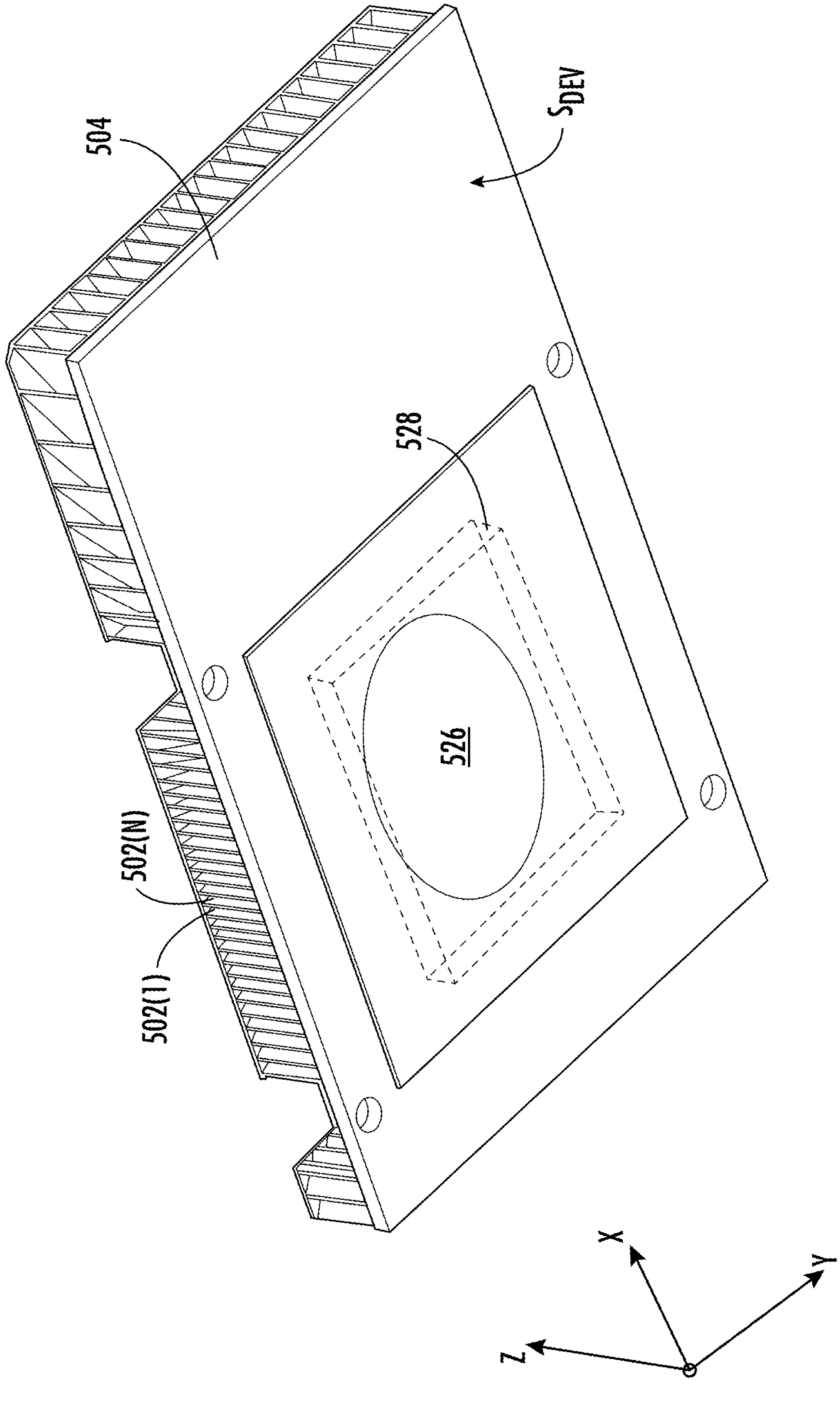

FIGS. 5A-5C are illustrations of a second exemplary heat-dissipation structure 500 corresponding to the illustrations of the heat-dissipation structure 200 in FIGS. 2A, 2B, and 2D. The heat-dissipation structure 500 is similar in many aspects to the heat-dissipation structure 200 in FIG. 1, including fins 502(1)-502(N) on a first substrate 504, and a second substrate 506 disposed on the fins 502(1)-502(N) to enclose a first region 508 of a first side $S_{FIN}$ of the first substrate 504. In the heat-dissipation structure 500, a center $C_{508}$ of the first region 508, in which a fan 510 may be disposed, is displaced from a center $C_{504}$ of the first substrate 504.

FIG. 5A is a view of the heat-dissipation structure 500 from a first perspective showing the second substrate 506 disposed on the plurality of fins 502(1)-502(N). The second substrate 506 is approximately the same rectangular shape as the first substrate 504 except for cut-outs 512(1)-512(4) corresponding to fastener regions 514(1)-514(4) on the first substrate 504, in which the fins 502(1)-502(N) are excluded. As noted above, unlike the heat-dissipation structure 200 in FIGS. 2A-2D, the first region 508 of the heat-dissipation structure 500 is offset or displaced from a center $C_{504}$ (e.g., geometric center) of the first substrate 504. In this example, a first distance D1 from a perimeter 516 the first region 508 to a first edge 518(1) is shorter in length than a second distance D2 from the perimeter 516 to a second edge 518(2), while distances D3 and D4 from the perimeter 516 to the third edge 520(1) and the fourth edge 520(2) may be the same in length. Additionally or alternatively, in some examples, the distances D3 and D4 may be different from each other. It should be understood that a location of the first region 508 corresponds to a position expected to be a hot spot on the first substrate 504, which may depend on the location of a region on the second side $S_{DEV}$ in which a heat-generating device may be coupled to the first substrate 504, which may be design dependent.

In an example not shown, the fins 502(1)-502(N) extending from the perimeter 516 toward the fourth edge 520(2) may terminate at boundary 522, which is at a same distance D3 from the perimeter 516 as the third edge 520(1), such that the plurality of fins 502(1)-502(N) extending from the perimeter 516 toward the fourth edge 520(2) would be symmetrical (e.g., same respective lengths) to the fins 502 (1)-502(N) extending from the perimeter 516 toward the third edge 520(1). In such case, the fins 502(1)-502(N) would not extend to the first edge 520(2) of the first substrate 504.

FIG. 5B shows the heat-dissipation structure 500 from a second perspective and without the second substrate 506 (see FIG. 5A) to more clearly show the fins 502(1)-502(N) are at a consistent radial fin pitch $FP_{502}$ around a center axis 524 of the fan 510. FIG. 5B also shows that the fins 502(1)-502(N) extending to the second edge 518(2) are longer than the fins 502(1)-502(N) extending to the first edge 518(1) in this example. In some examples, to provide a more symmetric dissipation of heat, the fins 502(1)-502(N) directed toward the second edge 518(2) may be terminated at the boundary 522.

FIG. 5C shows a second region 526 on a second side $S_{DEV}$ of the first substrate 504, opposite to the first region 508 (see FIG. 5B), where a heat-generating device 528 comprising electronic circuits may be thermally coupled to the heat-dissipation structure 500. Heat from the second region 526 is conducted to the first region 508 and may be dissipated by the fins 502(1)-502(N).

Heat-dissipation structures as disclosed herein of an appropriate size may be included to cool electronic devices in or integrated into any processor-based device. Examples of such processor-based device, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, laptop computer, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, and a vehicle component.

Figure 6:
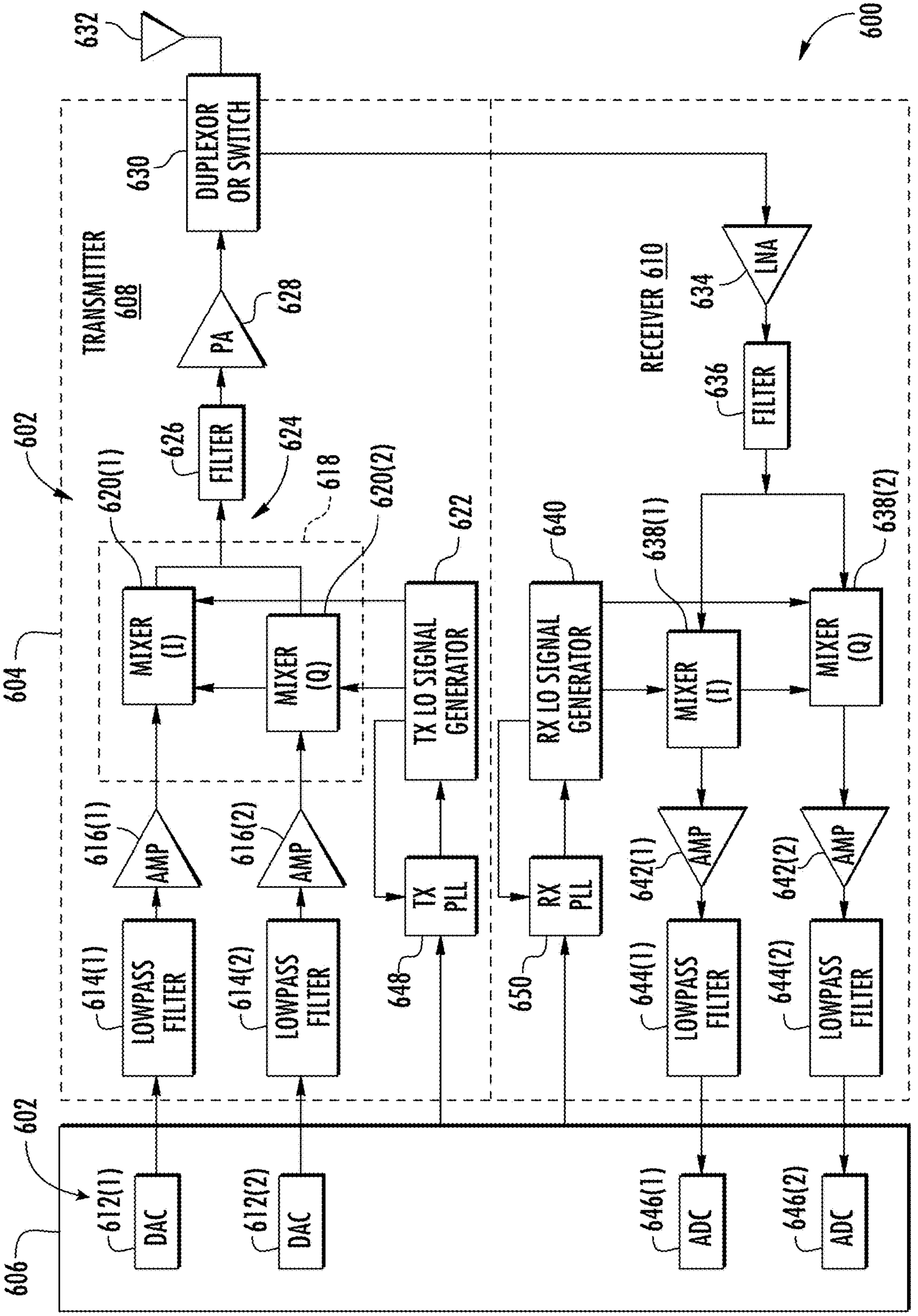
FIG. 6 is a block diagram of an exemplary processor-based system that can include the exemplary heat-dissipation structure including fins extending orthogonally from a first side of a first substrate to a second substrate and radially from a first region of the first substrate, wherein a fan may be disposed in the first region in FIGS. 2A-2D and 5A-5C.

FIG. 6 illustrates an exemplary wireless communications device 600 that includes radio-frequency (RF) components formed from one or more ICs 602, wherein any of the ICs 602 can be thermally coupled to an exemplary heat-dissipation structure including fins extending orthogonally from a first side of a first substrate to a second substrate and radially from a first region of the first substrate, wherein a fan may be disposed in the first region, including but not limited to the heat-dissipation structure 200, 500 in FIGS. 2A-2D and 5A-5C. The wireless communications device 600 may include or be provided in any of the above-referenced devices, as examples. As shown in FIG. 6, the wireless communications device 600 includes a transceiver 604 and a data processor 606. The data processor 606 may include a memory to store data and program codes. The transceiver 604 includes a transmitter 608 and a receiver 610 that support bi-directional communications. In general, the wireless communications device 600 may include any number of transmitters 608 and/or receivers 610 for any number of communication systems and frequency bands. All or a portion of the transceiver 604 may be implemented on one or more analog ICs, RF ICs (RFICs), mixed-signal ICs, etc.

The transmitter 608 or the receiver 610 may be implemented with a super-heterodyne architecture or a direct-conversion architecture. In the super-heterodyne architecture, a signal is frequency-converted between RF and baseband in multiple stages, for example, from RF to an intermediate frequency (IF) in one stage and then from IF to baseband in another stage for the receiver 610. In the direct-conversion architecture, a signal is frequency-converted between RF and baseband in one stage. The super-heterodyne and direct-conversion architectures may use different circuit blocks and/or have different requirements. In the wireless communications device 600 in FIG. 6, the transmitter 608 and the receiver 610 are implemented with the direct-conversion architecture.

In the transmit path, the data processor 606 processes data to be transmitted and provides I and Q analog output signals to the transmitter 608. In the exemplary wireless communications device 600, the data processor 606 includes digital-to-analog converters (DACs) 612(1), 612(2) for converting digital signals generated by the data processor 606 into the I and Q analog output signals (e.g., I and Q output currents) for further processing.

Within the transmitter 608, lowpass filters 614(1), 614(2) filter the I and Q analog output signals, respectively, to remove undesired signals caused by the prior digital-to-analog conversion. Amplifiers (AMPs) 616(1), 616(2) amplify the signals from the lowpass filters 614(1), 614(2), respectively, and provide I and Q baseband signals. An upconverter 618 upconverts the I and Q baseband signals with I and Q transmit (TX) local oscillator (LO) signals through mixers 620(1), 620(2) from a TX LO signal generator 622 to provide an upconverted signal 624. A filter 626 filters the upconverted signal 624 to remove undesired signals caused by the frequency up-conversion as well as noise in a receive frequency band. A power amplifier (PA) 628 amplifies the upconverted signal 624 from the filter 626 to obtain the desired output power level and provides a transmit RF signal. The transmit RF signal is routed through a duplexer or switch 630 and transmitted via an antenna 632.

In the receive path, the antenna 632 receives signals transmitted by base stations and provides a received RF signal, which is routed through the duplexer or switch 630 and provided to a low noise amplifier (LNA) 634. The duplexer or switch 630 is designed to operate with a specific receive (RX)-to-TX duplexer frequency separation, such that RX signals are isolated from TX signals. The received RF signal is amplified by the LNA 634 and filtered by a filter 636 to obtain a desired RF input signal. Down-conversion mixers 638(1), 638(2) mix the output of the filter 636 with I and Q RX LO signals (i.e., LO_I and LO_Q) from an RX LO signal generator 640 to generate I and Q baseband signals. The I and Q baseband signals are amplified by AMPs 642(1), 642(2) and further filtered by lowpass filters 644(1), 644(2) to obtain I and Q analog input signals, which are provided to the data processor 606. In this example, the data processor 606 includes analog-to-digital converters (ADCs) 646(1), 646(2) for converting the analog input signals into digital signals to be further processed by the data processor 606.

In the wireless communications device 600 of FIG. 6, the TX LO signal generator 622 generates the I and Q TX LO signals used for frequency up-conversion, while the RX LO signal generator 640 generates the I and Q RX LO signals used for frequency down-conversion. Each LO signal is a periodic signal with a particular fundamental frequency. A TX phase-locked loop (PLL) circuit 648 receives timing information from the data processor 606 and generates a control signal used to adjust the frequency and/or phase of the TX LO signals from the TX LO signal generator 622. Similarly, an RX PLL circuit 650 receives timing information from the data processor 606 and generates a control signal used to adjust the frequency and/or phase of the RX LO signals from the RX LO signal generator 640.

Figure 7:
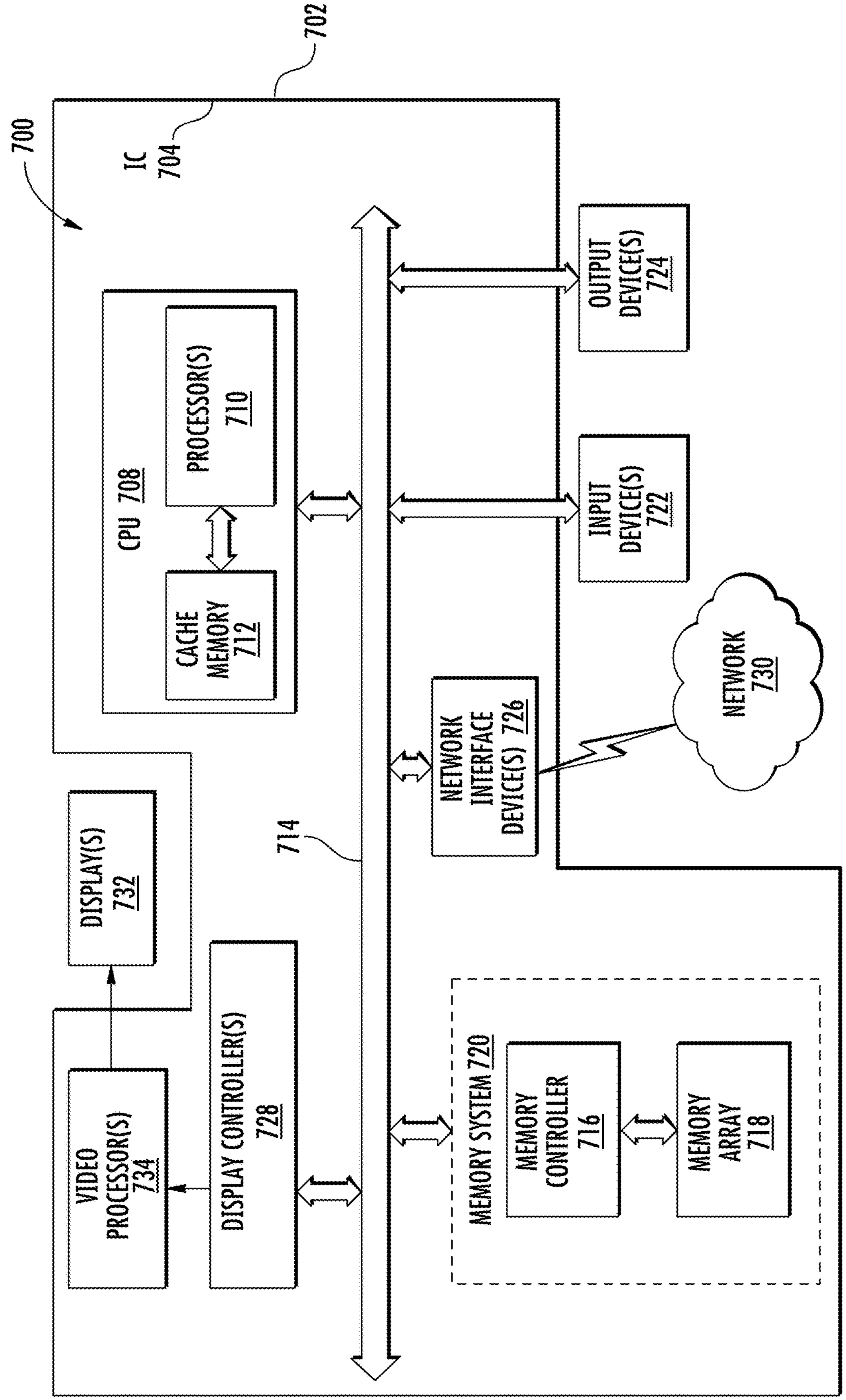
FIG. 7 is a block diagram of an exemplary wireless communication device that includes radio-frequency (RF) components that can include the exemplary heat-dissipation structure including fins extending orthogonally from a first side of a first substrate to a second substrate and radially from a first region of the first substrate, wherein a fan may be disposed in the first region in FIGS. 2A-2D and 5A-5C.

In this regard, FIG. 7 illustrates an example of a processor-based system 700 that can include an exemplary heat-dissipation structure 702 including fins extending orthogonally from a first side of a first substrate to a second substrate and radially from a first region of the first substrate, wherein a fan may be disposed in the first region, including but not limited to the heat-dissipation structure 200, 500 in FIGS. 2A-2D and 5A-5C. In this example, the processor-based system 700 may be formed as an IC 704 and as a system-on-a-chip (SoC) 706 coupled to a heat-dissipation structure 200, 500. The processor-based system 700 includes a central processing unit (CPU) 708 that includes one or more processors 710, which may also be referred to as CPU cores or processor cores. The CPU 708 may have cache memory 712 coupled to the CPU 708 for rapid access to temporarily stored data. The CPU 708 is coupled to a system bus 714 and can intercouple master and slave devices included in the processor-based system 700. As is well known, the CPU 708 communicates with these other devices by exchanging address, control, and data information over the system bus 714. For example, the CPU 708 can communicate bus transaction requests to a memory controller 716, as an example of a slave device. Although not illustrated in FIG. 7, multiple system buses 714 could be provided, wherein each system bus 714 constitutes a different fabric.

Other master and slave devices can be connected to the system bus 714. As illustrated in FIG. 7, these devices can include a memory system 720 that includes the memory controller 716 and a memory array(s) 718, one or more input devices 722, one or more output devices 724, one or more network interface devices 726, and one or more display controllers 728, as examples. The input device(s) 722 can include any type of input device, including, but not limited to, input keys, switches, voice processors, etc. The output device(s) 724 can include any type of output device, including, but not limited to, audio, video, other visual indicators, etc. The network interface device(s) 726 can be any device configured to allow exchange of data to and from a network 730. The network 730 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 726 can be configured to support any type of communications protocol desired.

The CPU 708 may also be configured to access the display controller(s) 728 over the system bus 714 to control information sent to one or more displays 732. The display controller(s) 728 sends information to the display(s) 732 to be displayed via one or more video processor(s) 734, which process the information to be displayed into a format suitable for the display(s) 732. The display(s) 732 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium wherein any such instructions are executed by a processor or other processing device, or combinations of both. The devices and components described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

Implementation examples are described in the following numbered clauses:

1. A heat-dissipation structure, comprising:
   a first substrate of a first material comprising a first side comprising a first region;
   a plurality of fins of the first material disposed around the first region, each of the plurality of fins extending in a first direction orthogonal to the first side of the first substrate and extending in respective second directions radial from the first region; and
   a second substrate disposed on the plurality of fins.
2. The heat-dissipation structure of clause 1, further comprising a fan disposed in the first region between the first substrate and the second substrate.
3. The heat-dissipation structure of clause 1 or clause 2, wherein the first material comprises a metal.
4. The heat-dissipation structure of any of clause 1 to clause 3, wherein:
   the first region comprises a circular region; and
   first ends of the plurality of fins are located along a perimeter of the circular region.
5. The heat-dissipation structure of clause 4, wherein the first ends of the plurality of fins are disposed at a first pitch along the perimeter of the circular region.
6. The heat-dissipation structure of any of clause 1 to clause 5, wherein at least one of the plurality of fins extends in the respective second direction to a first edge of the first substrate.
7. The heat-dissipation structure of clause 6, wherein:
   the first substrate is rectangular; and
   at least one of the plurality of fins extends to a second edge parallel to the first edge.
8. The heat-dissipation structure of clause 7, the first substrate further comprising:
   a third edge orthogonal to the first edge; and
   a fourth edge parallel to the third edge,
   wherein:
   at least one of the plurality of fins extends to the third edge; and
   at least one of the plurality of fins extends to the fourth edge.
9. The heat-dissipation structure of any of clause 1 to clause 8, wherein each of the plurality of fins extends to a same first height in the first direction from the first side of the first substrate.
10. The heat-dissipation structure of any of clause 2 to clause 9, wherein the fan comprises a center axis extending in the first direction.
11. The heat-dissipation structure of any of clause 2 to clause 10, the first substrate further comprising at least one fastener region configured to receive a fastener to secure the heat-dissipation structure in a package, wherein the plurality of fins is excluded from the at least one fastener region.
12. The heat-dissipation structure of any of clause 1 to clause 11, comprising a second region opposite to the first region on a second side of the first substrate and configured to couple to a heat generating circuit.
13. The heat-dissipation structure of any of clause 1 to clause 12, wherein the first region is centered at a center of the first substrate.
14. The heat-dissipation structure of any of clause 1 to clause 12, wherein a center of the first region is displaced from a center of the first substrate.
15. The heat-dissipation structure of any of clause 1 to clause 14, wherein the plurality of fins are disposed at a radial fin pitch around a center of the first region.
16. The heat-dissipation structure of clause 15, wherein the radial fin pitch comprises first angle between the respective second directions of adjacent fins of the plurality of fins and the radial fin pitch is in a range between two (2) degrees and three (3) degrees.
17. The heat-dissipation structure of clause 15 or clause 16, wherein the radial fin pitch is 2.5 degrees.
18. The heat-dissipation structure of clause 17, wherein:
   the plurality of fins comprises one-hundred forty-three (143) fins disposed at the radial fin pitch of 2.5 degrees around the first region; and
   a second fin pitch between a first one of the plurality of fins and a last one of the plurality of fins is five (5) degrees.
19. The heat-dissipation structure of any of clause 1 to clause 18 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; and a vehicle component.

20. A method of a heat-dissipation structure, comprising:
disposing, on a first side of a first substrate of a first material, a plurality of fins of the first material around a first region, each of the plurality of fins extending in a first direction orthogonal to the first side and extending in respective second directions radial from the first region; and
disposing a second substrate on the plurality of fins.

What is claimed is:

1. A heat-dissipation structure, comprising:
a first substrate of a first material comprising a first side comprising a first region;
a plurality of fins of the first material disposed around the first region, each of the plurality of fins extending in a first direction orthogonal to the first side of the first substrate and extending in respective second directions radial from the first region; and
a second substrate disposed on the plurality of fins, wherein:
the plurality of fins are disposed at a radial fin pitch around a center of the first region; and
the radial fin pitch is in a range of 2.25 degrees to 2.75 degrees.

2. The heat-dissipation structure of claim 1, further comprising a fan disposed in the first region between the first substrate and the second substrate.

3. The heat-dissipation structure of claim 1, wherein the first material comprises a metal.

4. The heat-dissipation structure of claim 1, wherein:
the first region comprises a circular region; and
first ends of the plurality of fins are located along a perimeter of the circular region.

5. The heat-dissipation structure of claim 4, wherein the first ends of the plurality of fins are disposed at a first pitch along the perimeter of the circular region.

6. The heat-dissipation structure of claim 1, wherein at least one of the plurality of fins extends in the respective second direction to a first edge of the first substrate.

7. The heat-dissipation structure of claim 6, wherein:
the first substrate is rectangular; and
at least one of the plurality of fins extends to a second edge parallel to the first edge.

8. The heat-dissipation structure of claim 7, the first substrate further comprising:
a third edge orthogonal to the first edge; and
a fourth edge parallel to the third edge,
wherein:
at least one of the plurality of fins extends to the third edge; and
at least one of the plurality of fins extends to the fourth edge.

9. The heat-dissipation structure of claim 1, wherein each of the plurality of fins extends to a same first height in the first direction from the first side of the first substrate.

10. The heat-dissipation structure of claim 2, wherein the fan comprises a center axis extending in the first direction.

11. The heat-dissipation structure of claim 2, the first substrate further comprising at least one fastener region configured to receive a fastener to secure the heat-dissipation structure in a package, wherein the plurality of fins is excluded from the at least one fastener region.

12. The heat-dissipation structure of claim 1, comprising a second region opposite to the first region on a second side of the first substrate and configured to couple to a heat generating circuit.

13. The heat-dissipation structure of claim 1, wherein the first region is centered at a center of the first substrate.

14. The heat-dissipation structure of claim 1, wherein the center of the first region is displaced from a center of the first substrate.

15. The heat-dissipation structure of claim 1, wherein:
the plurality of fins comprises one-hundred forty-three (143) fins disposed at the radial fin pitch in the range of 2.25 to 2.75 degrees around the center of the first region; and
a second fin pitch between a first one of the plurality of fins and a last one of the plurality of fins is five (5) degrees.

16. The heat-dissipation structure of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; and a vehicle component.

17. A method of a heat-dissipation structure, comprising:
disposing, on a first side of a first substrate of a first material, a plurality of fins of the first material at a radial fin pitch in a range of 2.25 degrees to 2.75 degrees around a center of a first region, each of the plurality of fins extending in a first direction orthogonal to the first side and extending in respective second directions radial from the first region; and
disposing a second substrate on the plurality of fins.

18. The heat-dissipation structure of claim 1, wherein the radial fin pitch comprises a first angle between the respective second directions of adjacent fins of the plurality of fins.

* * * * *